United States Patent
Shin et al.

(10) Patent No.: US 10,288,677 B2
(45) Date of Patent: May 14, 2019

(54) SEMICONDUCTOR DEVICE METHOD RELATING TO LATCH CIRCUIT TESTING

(71) Applicant: SK hynix Inc., Icheon-si, Gyeonggi-do (KR)

(72) Inventors: Tae Kyun Shin, Icheon-si Gyeonggi-do (KR); Young Bo Shim, Dangjin-si Chungcheongnam-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 91 days.

(21) Appl. No.: 15/471,866

(22) Filed: Mar. 28, 2017

(65) Prior Publication Data

US 2018/0059181 A1 Mar. 1, 2018

(30) Foreign Application Priority Data

Aug. 23, 2016 (KR) .................. 10-2016-0106758

(51) Int. Cl.
*G01R 31/28* (2006.01)
*G01R 31/317* (2006.01)
*G01R 31/3177* (2006.01)

(52) U.S. Cl.
CPC ... *G01R 31/31703* (2013.01); *G01R 31/3177* (2013.01); *G01R 31/31701* (2013.01); *G01R 31/31722* (2013.01)

(58) Field of Classification Search
CPC ........ G01R 31/31703; G01R 31/31701; G01R 31/3177; G01R 31/31722
See application file for complete search history.

(56) References Cited

U.S. PATENT DOCUMENTS

| | | | | |
|---|---|---|---|---|
| 2002/0186598 A1* | 12/2002 | Ooishi | ..................... | G11C 7/06 365/200 |
| 2011/0292710 A1* | 12/2011 | Matsubayashi | ....... | G11C 11/406 365/94 |
| 2012/0275247 A1* | 11/2012 | Hwang | .............. | G11C 29/4401 365/200 |
| 2016/0211011 A1* | 7/2016 | Qian | ..................... | G11C 11/418 |

FOREIGN PATENT DOCUMENTS

KR 20150030430 A 3/2015

* cited by examiner

*Primary Examiner* — Thien Nguyen
(74) *Attorney, Agent, or Firm* — William Park & Associates Ltd.

(57) ABSTRACT

A semiconductor device may be provided. The semiconductor device may include a latch comparison circuit configured for generating a latched address by latching a pattern signal inputted through an address, and generate a comparison signal by comparing a pattern signal inputted through the address and the latched address. The semiconductor device may include a failure flag generation circuit configured for generating a failure flag signal based on the comparison signal.

21 Claims, 4 Drawing Sheets

SEMICONDUCTOR DEVICE METHOD RELATING TO LATCH CIRCUIT TESTING

CROSS-REFERENCE TO RELATED APPLICATION

The present application claims priority under 35 U.S.C. § 119(a) to Korean Patent Application No. 10-2016-0106758 filed on Aug. 23, 2016 in the Korean Intellectual Property Office, which is incorporated herein by reference in its entirety.

BACKGROUND

1. Technical Field

Embodiments of the present disclosure may generally relate to an integrated circuit, and more particularly, to an integrated circuit and method relating to latch circuit testing.

2. Related Art

An integrated circuit including a semiconductor device includes a latch circuit to store data and signals. The latch circuit may latch and store data and signals in synchronization with a clock. The latch circuit may latch and store data and signals according to a control signal which is enabled under a preset condition.

The latch circuit included in a semiconductor device may include information on a failed cell, and may be used in replacing the failed cell with a redundancy cell in a repair operation.

SUMMARY

In an embodiment, a semiconductor device may be provided. The semiconductor device may include a latch comparison circuit configured for generating a latched address by latching a pattern signal inputted through an address, and may generate a comparison signal by comparing a pattern signal inputted through the address and the latched address. The semiconductor device may include a failure flag generation circuit configured for generating a failure flag signal based on the comparison signal.

In an embodiment, a semiconductor device may be provided. The semiconductor device may include an internal code generation circuit configured for generating an internal code according to an operating pulse which is generated based on an internal command. The semiconductor device may include a select signal generation circuit configured for generating a first select signal and a second select signal which are selectively enabled based on the internal code. The semiconductor device may include a latch comparison circuit configured for generating a first latched address by latching a first pattern signal inputted through an address, based on a test mode signal and the first select signal, and generating a first comparison signal by comparing the first pattern signal inputted through the address and the first latched address, based on the test mode signal and the first select signal.

In an embodiment, a method for testing a latch circuit may be provided. The method may include generating a first latched address by latching a first pattern signal inputted through an address. The method may include generating a first comparison signal by comparing the first pattern signal inputted through the address and the first latched address. The method may include generating a second latched address by latching a second pattern signal inputted through the address. The method may include generating a second comparison signal by comparing the second pattern signal inputted through the address and the second latched address.

In an embodiment, a semiconductor device may be provided. The semiconductor device may include a latch comparison circuit configured for generating a latched address by latching a pattern signal inputted through an address, and generate a comparison signal by comparing a pattern signal inputted through the address and the latched address. The semiconductor device may include a failure flag generation circuit configured for generating a failure flag signal based on the comparison signal.

In an embodiment, a method for testing a latch circuit may be provided. The method may include generating a latched address by latching a first pattern signal inputted through an address. The method may include generating a comparison signal by comparing the first pattern signal inputted through the address and the latched address. The method may include generating a failure flag signal based on the comparison signal.

DETAILED DESCRIPTION

Hereinafter, a semiconductor device for providing a method of testing a latch circuit will be described below with reference to the accompanying drawings through various examples of embodiments.

Various embodiments may be directed to a semiconductor device which provides a test method capable of testing a latch circuit.

According to some embodiments, it may be possible to easily check a failure of a latch circuit which stores information.

Figure 1:
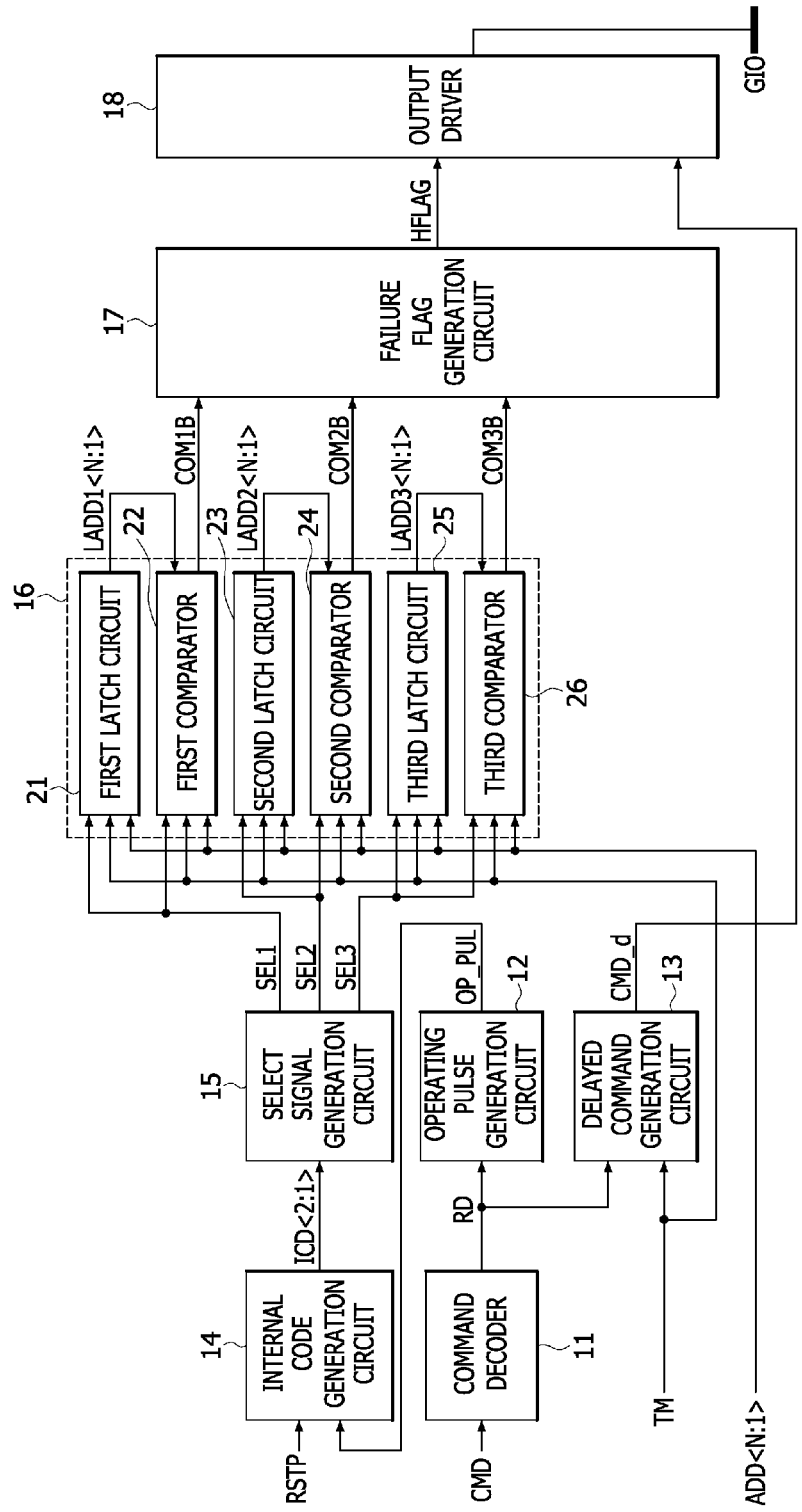
FIG. 1 is a block diagram illustrating a representation of an example of the configuration of a semiconductor device in accordance with an embodiment.

Referring to FIG. 1, a semiconductor device in accordance with an embodiment may include a command decoder 11, an operating pulse generation circuit 12, a delayed command generation circuit 13, an internal code generation circuit 14, a select signal generation circuit 15, a latch comparison circuit 16, a failure flag generation circuit 17, and an output driver 18.

The command decoder 11 may decode a command CMD and generate an internal command RD. The command CMD may be applied from at least one external device among a memory controller, a host and test equipment. According to an embodiment, the command CMD may be realized as a signal which includes a plurality of bits. The internal command RD may be a signal which is enabled in the case where a read operation is performed. According to an embodiment, the internal command RD may be realized as a signal which is enabled in the case where various internal operations such as a write operation, a refresh operation and an initialization operation are performed.

The operating pulse generation circuit 12 may generate an operating pulse OP_PUL in response to the internal command RD. The operating pulse generation circuit 12 may generate the operating pulse OP_PUL in the case where the internal command RD is enabled to perform an internal operation. For example, the operating pulse generation circuit 12 may generate the operating pulse OP_PUL in synchronization with a time at which the internal command RD is enabled, in the case where the internal command RD is enabled for a read operation.

The delayed command generation circuit 13 may generate a delayed command CMD_d in response to a test mode signal TM and the internal command RD. The delayed command generation circuit 13 may block generation of the delayed command CMD_d in the case where the test mode signal TM is a first logic level. The delayed command generation circuit 13 may generate the delayed command CMD_d by delaying the internal command RD in the case where the test mode signal TM is a second logic level. The first logic level may be set to a logic low level, and the second logic level may be set to a logic high level. The first logic level and the second logic level may be set differently according to an embodiment.

The internal code generation circuit 14 may generate an internal code ICD<2:1> in response to a reset pulse RSTP and the operating pulse OP_PUL. The internal code generation circuit 14 may generate the internal code ICD<2:1> which is sequentially counted each time a pulse included in the operating pulse OP_PUL is generated. For example, the internal code generation circuit 14 may generate the internal code ICD<2:1> which is set to '01' in the case where the first pulse of the operating pulse OP_PUL is generated, generate the internal code ICD<2:1> which is set to '10' in the case where the second pulse of the operating pulse OP_PUL is generated, and generate the internal code ICD<2:1> which is set to '11' in the case where the third pulse of the operating pulse OP_PUL is generated. The fact that the internal code ICD<2:1> is set to '01' means that the first bit ICD<1> of the internal code ICD<2:1> is set to a logic high level and the second bit ICD<2> of the internal code ICD<2:1> is set to a logic low level. The internal code generation circuit 14 may set the internal code ICD<2:1> to an initial logic level combination in the case where the pulse of the reset pulse RSTP is generated. The initial logic level combination of the internal code ICD<2:1> may be set to '00.'

The select signal generation circuit 15 may generate a first select signal SEL1, a second select signal SEL2 and a third select signal SEL3 in response to the internal code ICD<2:1>. The select signal generation circuit 15 may generate the first select signal SEL1, the second select signal SEL2 and the third select signal SEL3 which are selectively enabled depending on the logic level combination of the internal code ICD<2:1>. For example, the select signal generation circuit 15 may generate the first select signal SEL1 which is enabled and the second select signal SEL2 and the third select signal SEL3 which are disabled, in the case where the internal code ICD<2:1> is generated as '01.' The select signal generation circuit 15 may generate the second select signal SEL2 which is enabled and the first select signal SEL1 and the third select signal SEL3 which are disabled, in the case where the internal code ICD<2:1> is generated as '10.' The select signal generation circuit 15 may generate the third select signal SEL3 which is enabled and the first select signal SEL1 and the second select signal SEL2 which are disabled, in the case where the internal code ICD<2:1> is generated as '11.' A logic level at which the first select signal SEL1, the second select signal SEL2 and the third select signal SEL3 are enabled may be set differently according to an embodiment.

The latch comparison circuit 16 may include a first latch circuit 21, a first comparator 22, a second latch circuit 23, a second comparator 24, a third latch circuit 25, and a third comparator 26. In an embodiment, the first latch circuit 21, the second latch circuit 23 and the third latch circuit 25 may be realized as fuse circuits which store failure informations for a repair operation. The first latch circuit 21, the second latch circuit 23 and the third latch circuit may be realized to store various informations of the semiconductor device according to an embodiment.

The first latch circuit 21 may generate a first latched address LADD1<N:1> by latching an address ADD<N:1> in response to the test mode signal TM and the first select signal SEL1. The first latch circuit 21 may generate the first latched address LADD1<N:1> by latching the address ADD<N:1> in the case where the first select signal SEL1 is enabled in the state in which the test mode signal TM is the first logic level. The first comparator 22 may generate a first comparison signal COM1B by comparing the first latched address LADD1<N:1> and the address ADD<N:1> in response to the test mode signal TM and the first select signal SEL1. The first comparator 22 may generate the first comparison signal COM1B which is enabled in the case where the first latched address LADD1<N:1> and the address ADD<N:1> are not the same when the first select signal SEL1 is enabled in the state in which the test mode signal TM is the second logic level.

The second latch circuit 23 may generate a second latched address LADD2<N:1> by latching the address ADD<N:1> in response to the test mode signal TM and the second select signal SEL2. The second latch circuit 23 may generate the second latched address LADD2<N:1> by latching the address ADD<N:1> in the case where the second select signal SEL2 is enabled in the state in which the test mode signal TM is the first logic level. The second comparator 24 may generate a second comparison signal COM2B by comparing the second latched address LADD2<N:1> and the address ADD<N:1> in response to the test mode signal TM and the second select signal SEL2. The second comparator 24 may generate the second comparison signal COM2B which is enabled in the case where the second latched address LADD2<N:1> and the address ADD<N:1> are not the same when the second select signal SEL2 is enabled in the state in which the test mode signal TM is the second logic level.

The third latch circuit 25 may generate a third latched address LADD3<N:1> by latching the address ADD<N:1> in response to the test mode signal TM and the third select signal SEL3. The third latch circuit 25 may generate the third latched address LADD3<N:1> by latching the address ADD<N:1> in the case where the third select signal SEL3 is enabled in the state in which the test mode signal TM is the first logic level. The third comparator 26 may generate a third comparison signal COM3B by comparing the third latched address LADD3<N:1> and the address ADD<N:1> in response to the test mode signal TM and the third select signal SEL3. The third comparator 26 may generate the third comparison signal COM3B which is enabled in the case where the third latched address LADD3<N:1> and the address ADD<N:1> are not the same when the third select signal SEL3 is enabled in the state in which the test mode signal TM is the second logic level. The first logic level may be set to a logic low level, and the second logic level may be set to a logic high level. The first logic level and the second logic level may be set differently according to an embodiment. A logic level at which the first comparison signal COM1B, the second comparison signal COM2B and the third comparison signal COM3B are enabled may be set differently according to an embodiment.

The failure flag generation circuit 17 may generate a failure flag HFLAG in response to the first comparison signal COM1B, the second comparison signal COM2B and the third comparison signal COM3B. The failure flag generation circuit 17 may generate the failure flag HFLAG which is enabled in the case where at least one of the first comparison signal COM1B, the second comparison signal COM2B and the third comparison signal COM3B is enabled. A logic level at which the failure flag HFLAG is enabled may be set differently according to an embodiment.

The output driver 18 may output the failure flag HFLAG to an input and output (input/output) line GIO in response to the delayed command CMD_d. The output driver 18 may output the failure flag HFLAG through the input/output line GIO in the state in which the delayed command CMD_d is generated by delaying the internal command RD in response to the test mode signal TM. The failure flag HFLAG may be transferred to at least one external device among a memory controller, a host and test equipment through the input/output line GIO.

Figure 2:
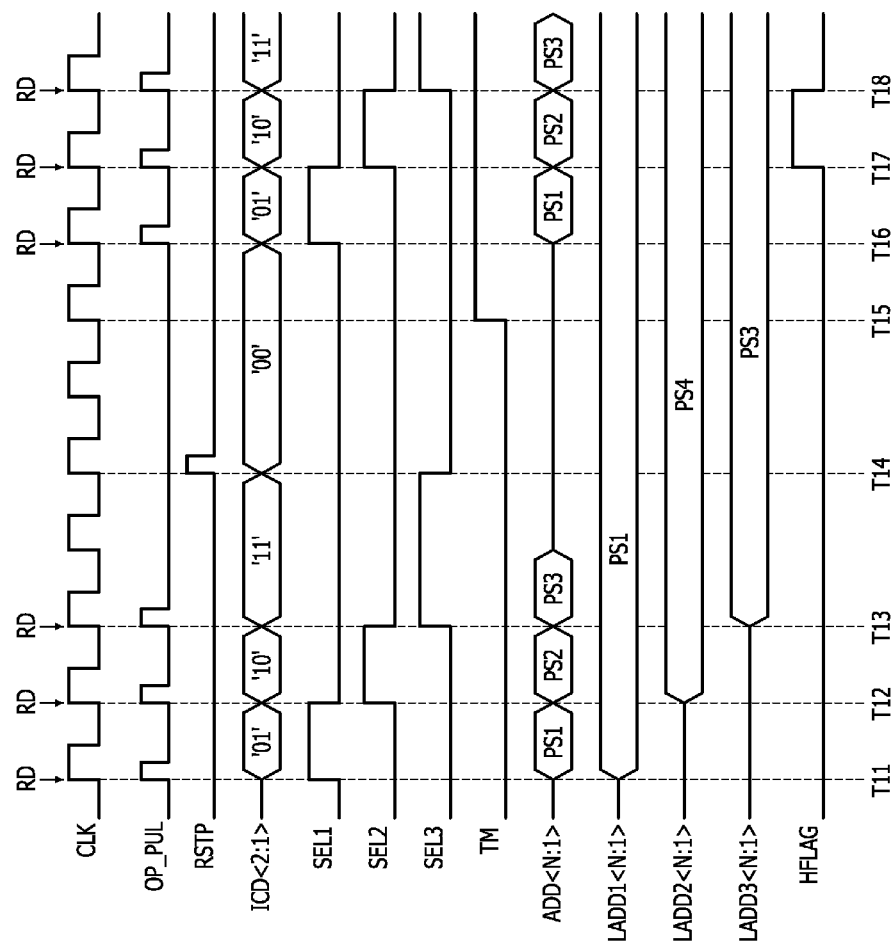
FIG. 2 is a representation of an example of a timing diagram to assist in the explanation of a test operation performed in a semiconductor device illustrated in FIG. 1.

The semiconductor devices configured as mentioned above provide a test method for testing whether a failure has occurred in a latch circuit included therein. A test method in accordance with an embodiment will be described below with reference to FIG. 2.

At a time T11, if a first internal command RD is generated in the state in which the test mode signal TM is the logic low level, the internal code ICD<2:1> is set to '01' and the first select signal SEL1 is enabled to a logic high level. In the case where the first select signal SEL1 is enabled to the logic high level in the state in which the test mode signal TM is the logic low level, a first pattern signal PS1 inputted through the address ADD<N:1> is latched as the first latched address LADD1<N:1>.

At a time T12, if a second internal command RD is generated in the state in which the test mode signal TM is the logic low level, the internal code ICD<2:1> is set to '10' and the second select signal SEL2 is enabled to a logic high level. In the case where the second select signal SEL2 is enabled to the logic high level in the state in which the test mode signal TM is the logic low level, a second pattern signal PS2 inputted through the address ADD<N:1> is latched as the second latched address LADD2<N:1>. In the present embodiment, it is assumed, for example, that a failure has occurred in the second latch circuit 23 and thus the second latch circuit 23 does not latch and store the second pattern signal PS2 and stores a fourth pattern signal PS4.

At a time T13, if a third internal command RD is generated in the state in which the test mode signal TM is the logic low level, the internal code ICD<2:1> is set to '11' and the third select signal SEL3 is enabled to a logic high level. In the case where the third select signal SEL3 is enabled to the logic high level in the state in which the test mode signal TM is the logic low level, a third pattern signal PS3 inputted through the address ADD<N:1> is latched as the third latched address LADD3<N:1>.

At a time T14, if the pulse of the reset pulse RSTP is generated, the internal code ICD<2:1> is set to '00' as the initial logic level combination.

At a time T15, the test mode signal TM transitions from the logic low level to the logic high level.

At a time T16, if a first internal command RD is generated in the state in which the test mode signal TM is the logic high level, the internal code ICD<2:1> is set to '01' and the first select signal SEL1 is enabled to the logic high level. In the case where the first select signal SEL1 is enabled to the logic high level in the state in which the test mode signal TM is the logic high level, the first comparison signal COM1B is generated by comparing a first pattern signal PS1 inputted through the address ADD<N:1> and the first latched address LADD1<N:1>. Since the first latched address LADD1<N:1> is in the state in which it latches the first pattern signal PS1, the first comparison signal COM1B is disabled to a logic high level.

At a time T17, if a second internal command RD is generated in the state in which the test mode signal TM is the logic high level, the internal code ICD<2:1> is set to '10' and the second select signal SEL2 is enabled to the logic high level. In the case where the second select signal SEL2 is enabled to the logic high level in the state in which the test mode signal TM is the logic high level, the second comparison signal COM2B is generated by comparing a second pattern signal PS2 inputted through the address ADD<N:1> and the second latched address LADD2<N:1>. Since the second latched address LADD2<N:1> is in the state in which it latches the fourth pattern signal PS4, the second comparison signal COM2B is enabled to a logic low level. By the second comparison signal COM2B which is enabled, the failure flag HFLAG is enabled to a logic high level.

At a time T18, if a third internal command RD is generated in the state in which the test mode signal TM is the logic high level, the internal code ICD<2:1> is set to '11' and the third select signal SEL3 is enabled to the logic high level. In the case where the third select signal SEL3 is enabled to the logic high level in the state in which the test mode signal TM is the logic high level, the third comparison signal COM3B is generated by comparing a third pattern signal PS3 inputted through the address ADD<N:1> and the third latched address LADD3<N:1>. Since the third latched address LADD3<N:1> is in the state in which it latches the third pattern signal PS3, the third comparison signal COM3B is disabled to a logic high level.

Summarizing these, it may be seen that, by the test performed in a semiconductor device in accordance with an embodiment, the failure flag HFLAG which is enabled to the logic high level is generated from the time T17 to the time T18. The external device realized by test equipment or the like may sense the failure flag HFLAG and check that a failure has occurred in the second latch circuit 23.

Figure 3:
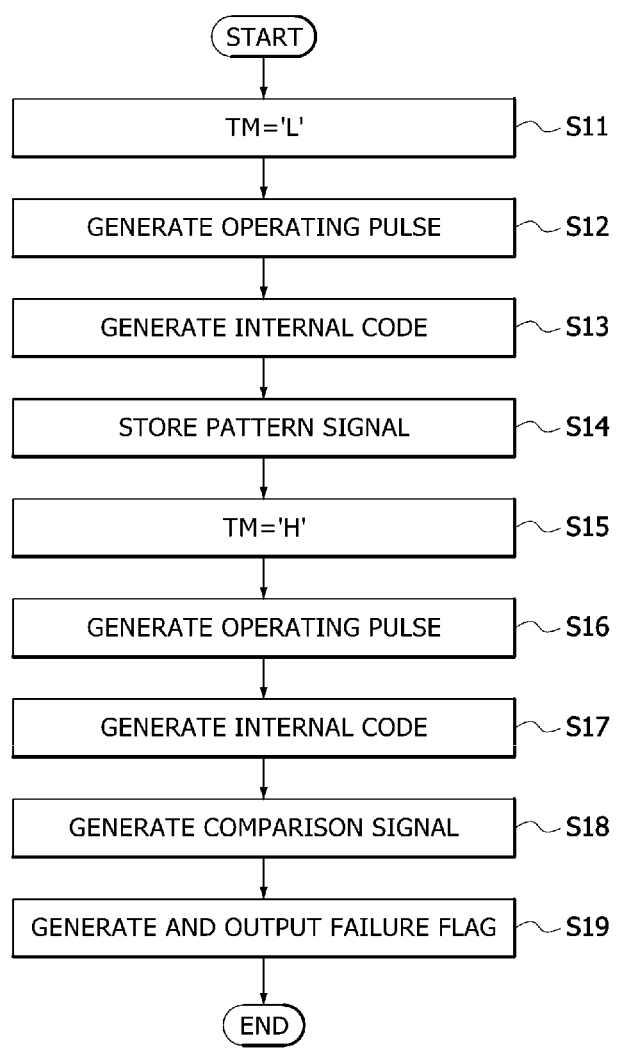
FIG. 3 is a representation of an example of a flow chart to assist in the explanation of a test operation performed in a semiconductor device illustrated in FIG. 1.

The test method provided in the semiconductor device in accordance with an embodiment will be described below with reference to FIG. 3.

After the test mode signal TM is set to the logic low level (S11), an operating pulse is generated by the internal command RD which is generated sequentially (S12). An internal code is counted and generated by the operating pulse (S13), and a pattern signal inputted through an address is latched and stored as a latched address (S14).

After the test mode signal TM is set to the logic high level (S15), an operating pulse is generated by the internal command RD which is generated sequentially (S16). An internal code is counted and generated by the operating pulse (S17), a comparison signal is generated by comparing a pattern signal inputted through an address and the pattern signal latched as the latched address (S18), and a failure flag which is generated from the comparison signal is outputted through an input/output line (S19).

Figure 4:
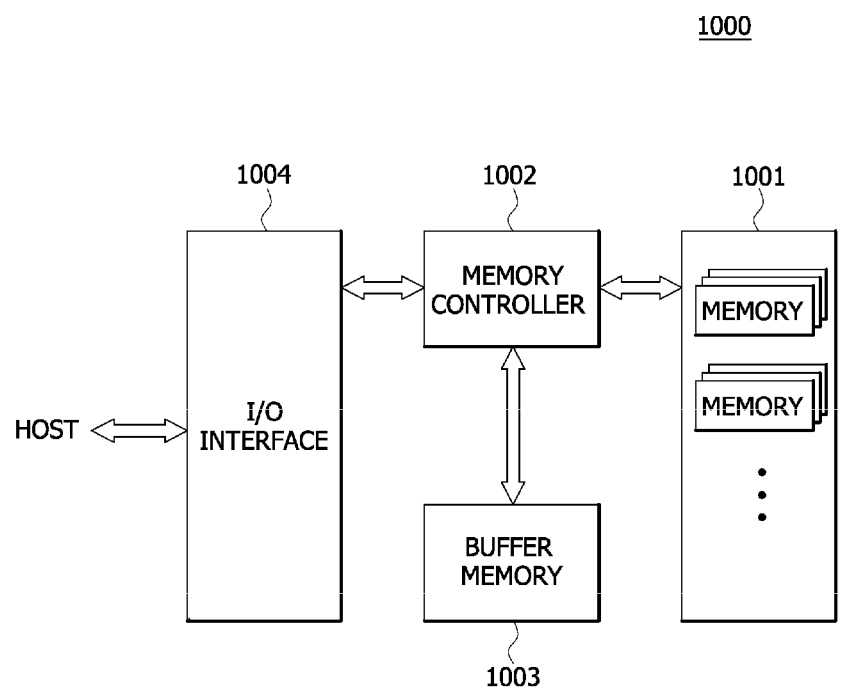
FIG. 4 is a diagram illustrating a representation of an example of the configuration of an electronic system to which a semiconductor device illustrated in FIG. 1 is applied.

The semiconductor device described above with reference to FIG. 1 may be applied to an electronic system which includes a memory system, a graphic system, a computing system or a mobile system. For example, referring to FIG. 4, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the semiconductor devices illustrated in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 4, a controller for controlling the data storage 1001 and a controller for controlling the buffer memory 1003 as a volatile memory may be independently configured in the memory controller 1002.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, a semiconductor device for providing a method of testing a latch circuit described herein should not be limited based on the described embodiments.

What is claimed is:

1. A semiconductor device comprising:
a latch comparison circuit configured for generating a latched address by latching a pattern signal when a select signal is enabled by an internal command, and generate a comparison signal by comparing a pattern signal and the latched address, when the select signal is enabled by the internal command; and
a failure flag generation circuit configured for generating a failure flag signal based on the comparison signal.

2. The semiconductor device according to claim 1, wherein the latch comparison circuit generates the latched address by latching the pattern signal, when the select signal is enabled in a state in which a test mode signal is a first logic level.

3. The semiconductor device according to claim 2, wherein the latch comparison circuit generates the comparison signal by comparing the pattern signal and the latched address, when the select signal is enabled in a state in which the test mode signal is a second logic level.

4. The semiconductor device according to claim 1, wherein the select signal includes a first select signal and a second select signal, the pattern signal includes a first pattern signal and a second pattern signal, the latched address includes a first latched address and a second latched address, and the comparison signal includes a first comparison signal and a second comparison signal.

5. The semiconductor device according to claim 4, wherein the latch comparison circuit generates the first latched address by latching the first pattern signal, based on a test mode signal and the first select signal, generates the first comparison signal by comparing the first pattern signal and the first latched address, based on the test mode signal and the first select signal, generates the second latched address by latching the second pattern signal, based on the test mode signal and the second select signal, and generates the second comparison signal by comparing the second pattern signal and the second latched address, based on the test mode signal and the second select signal.

6. The semiconductor device according to claim 4, wherein the latch comparison circuit comprises:
a first latch circuit configured for generating the first latched address by latching the address based on a test mode signal and the first select signal.

7. The semiconductor device according to claim 4, wherein the latch comparison circuit comprises:
a first comparator configured for generating the first comparison signal by comparing the address and the first latched address based on a test mode signal and the first select signal.

8. The semiconductor device according to claim 4, wherein the latch comparison circuit comprises:
a second latch circuit configured for generating the second latched address by latching the address based on a test mode signal and the second select signal.

9. The semiconductor device according to claim 4, wherein the latch comparison circuit comprises:
a second comparator configured for generating the second comparison signal by comparing the address and the second latched address based on a test mode signal and the second select signal.

10. The semiconductor device according to claim 1, wherein the comparison signal includes a first comparison signal and a second comparison signal, and the failure flag signal is enabled when at least one of the first comparison signal and the second comparison signal is enabled.

11. The semiconductor device according to claim 1, wherein the first comparison signal is enabled when the first pattern signal and the first latched address are different.

12. The semiconductor device according to claim 1, further comprising:
a command decoder configured for decoding a command and generating the internal command which is enabled to perform an internal operation.

13. The semiconductor device according to claim 12, wherein the internal operation is set to one among a read operation, a write operation and a refresh operation.

14. The semiconductor device according to claim 12, further comprising:
an operating pulse generation circuit configured for generating an operating pulse based on the internal command.

15. The semiconductor device according to claim 14, further comprising:
an internal code generation circuit configured for generating an internal code based on a rest pulse and the operating pulse; and
a select signal generation circuit configured for generating the select signal based on the internal code.

16. The semiconductor device according to claim 12, further comprising:
a delayed command generation circuit configured for generating a delayed command based on a test mode signal and the internal command; and
an output driver configured for outputting the failure flag to an input and output line based on the delayed command,
wherein the delayed command generation circuit blocks generation of the delayed command when the test mode signal is a first logic level and generates the delayed command by delaying the internal command when the test mode signal is a second logic level, and
wherein the input and output line allows for the failure flag to be transferred externally from the semiconductor device.

17. A semiconductor device comprising:
a select signal generation circuit configured for generating a first select signal enabled by an internal command and a second select signal enabled by the internal command; and
a latch comparison circuit configured for generating a first latched address by latching a first pattern signal when the first select signal is enabled, and generating a first comparison signal by comparing the first pattern signal and the first latched address when the second select signal is enabled.

18. The semiconductor device according to claim 17, wherein the latch comparison circuit comprises:
a first latch circuit configured for generating the first latched address by latching the address based on the test mode signal and the first select signal; and
a first comparator configured for generating the first comparison signal by comparing the address and the first latched address based on the test mode signal and the first select signal.

19. The semiconductor device according to claim 17, wherein the latch comparison circuit generates a second latched address by latching a second pattern signal, based on the test mode signal and the second select signal, and generating a second comparison signal by comparing the second pattern signal and the second latched address, based on the test mode signal and the second select signal.

20. The semiconductor device according to claim 19, further comprising:
a failure flag generation circuit configured for generating a failure flag signal based on the first comparison signal and the second comparison signal.

21. A method for testing a latch circuit, comprising:
generating a first latched address by latching a first pattern signal, when a first select signal is enabled by a first internal command;
generating a first comparison signal by comparing the first pattern signal and the first latched address when the first select signal is enabled by a second internal command;
generating a second latched address by latching a second pattern signal a second select signal is enabled by a third internal command; and
generating a second comparison signal by comparing the second pattern signal and the second latched address when the second select signal is enabled by a fourth internal command.

* * * * *

UNITED STATES PATENT AND TRADEMARK OFFICE
CERTIFICATE OF CORRECTION

| | |
|---|---|
| PATENT NO. | : 10,288,677 B2 |
| APPLICATION NO. | : 15/471866 |
| DATED | : May 14, 2019 |
| INVENTOR(S) | : Tae Kyun Shin et al. |

It is certified that error appears in the above-identified patent and that said Letters Patent is hereby corrected as shown below:

On the Title Page

Item (54):
Replace "SEMICONDUCTOR DEVICE METHOD RELATING TO LATCH CIRCUIT TESTING" with --SEMICONDUCTOR DEVICE AND METHOD RELATING TO LATCH CIRCUIT TESTING--

Signed and Sealed this
Eighteenth Day of June, 2019

Andrei Iancu
*Director of the United States Patent and Trademark Office*